(12) United States Patent
Matsuta

(10) Patent No.: US 6,781,484 B2
(45) Date of Patent: Aug. 24, 2004

(54) SAW FILTER MODULE CAPABLE OF BEING EASILY MINIATURIZED

(75) Inventor: Shigetoshi Matsuta, Fukushima (JP)

(73) Assignee: Alps Electric Co., Ltd., Tokyo (JP)

( * ) Notice: Subject to any disclaimer, the term of this patent is extended or adjusted under 35 U.S.C. 154(b) by 43 days.

(21) Appl. No.: 10/338,586

(22) Filed: Jan. 8, 2003

(65) Prior Publication Data

US 2003/0128083 A1 Jul. 10, 2003

(30) Foreign Application Priority Data

Jan. 9, 2002 (JP) ........................................ 2002-002508

(51) Int. Cl.[7] .............................. H03H 9/10; H03H 9/64
(52) U.S. Cl. ................................... 333/193; 310/313 R
(58) Field of Search ................................ 333/193–196, 333/133; 310/313 R, 348

(56) References Cited

U.S. PATENT DOCUMENTS

| 5,471,722 A | * | 12/1995 | Yatsuda | ....................... 29/25.35 |
| 5,786,738 A | * | 7/1998 | Ikata et al. | ................... 333/133 |
| 5,859,473 A | * | 1/1999 | Ikata et al. | ................... 257/723 |
| 6,150,904 A | * | 11/2000 | Taniguchi et al. | ........... 333/193 |
| 6,424,233 B1 | * | 7/2002 | Tonegawa et al. | ........... 333/133 |
| 6,570,469 B2 | * | 5/2003 | Yamada et al. | ............. 333/193 |
| 6,628,178 B2 | * | 9/2003 | Uchikoba | .................... 333/193 |

FOREIGN PATENT DOCUMENTS

| JP | 5-152881 | * | 6/1993 |
| JP | 5-235688 | * | 9/1993 |
| JP | 5-235689 | * | 9/1993 |
| JP | 2002-330050 | | 11/2002 |

* cited by examiner

*Primary Examiner*—Barbara Summons
(74) *Attorney, Agent, or Firm*—Brinks Hofer Gilson & Lione

(57) ABSTRACT

In a SAW filter module in which a SAW chip is mounted in a recess of a substrate, the recess is closed off by a sealing plate, and end-face electrodes are provided on external surfaces including the side surfaces of the substrate. An insulation layer having a smooth surface is provided on the side opposite to the sealing plate side of the substrate, and a thin film circuit, such as circuit elements, is formed on the insulation layer. A thin film circuit of high accuracy can be formed on the insulation layer, the number of chip components whose pitch between components is severely limited, and miniaturization of the entire module can be achieved.

6 Claims, 2 Drawing Sheets

SAW FILTER MODULE CAPABLE OF BEING EASILY MINIATURIZED

BACKGROUND OF THE INVENTION

1. Field of the Invention

The present invention relates to a surface-mount-type SAW filter module in which a SAW chip of an electronic part utilizing a Surface Acoustic Wave (SAW) on a piezoelectric substrate is built in as a filter, such as an antenna switching circuit.

2. Description of the Related Art

Recently, in antenna switching circuits or the like for transmitting and receiving high frequency signals, a SAW filter for selectively passing signals of specified frequencies has been extensively employed as a transmission filter and a reception filter. The SAW filter comprises a SAW chip having a predetermined electrode pattern, electrically connected thereto, formed on a surface of a piezoelectric substrate such as quartz. However, the SAW chip is a relatively large chip component, and when a SAW filter module such as an antenna circuit unit is manufactured by arranging a large number of circuit components including the SAW chip, the size of a module is less easily reduced if the SAW chip is mounted on an outer surface of the substrate.

Thus, a SAW filter module that can be miniaturized by placing the SAW chip in a recess of the substrate has been proposed, as shown in FIG. 4. The SAW filter module shown in FIG. 4 mainly comprises a multi-layered substrate (LTCC) 1, a SAW chip 2 mounted in a recess 1a of the multi-layered substrate 1, various kinds of chip components 3, such as a chip resistor and a chip capacitor, mounted on the top surface of the multi-layered substrate 1, end-face electrodes 4 extending from side surfaces of the multi-layered substrate 1 to the bottom surface and top surface thereof, and a sealing plate 5 such as a metal plate soldered at a certain position for closing-off the recess 1a of the multi-layered substrate 1.

The multi-layered substrate 1 is obtained by laminating green sheets formed of a low-temperature co-fired ceramic material, baking them at a temperature not higher than 1,000° C., and mounting them on a mother board (a base substrate), which is not shown. The SAW chip 2 is connected to a lead pattern 7 by a bonding wire 6, and the lead pattern 7 is led to the top surface of the multi-layered substrate 1 via a through hole (not shown). The SAW chip 2 and various kinds of chip components 3 are electrically connected to an external circuit via the end-face electrodes 4 by connecting the SAW chip 2 and various kinds of chip components 3 to the end-face electrodes 4 on the top surface of the multi-layered substrate 1. The SAW chip 2 is bonded to the top surface of a recess 1a of the multi-layered substrate 1, and the recess 1a is filled with inert gas such as nitrogen.

In recent years, the technology for miniaturizing circuit components, such as chip components and semiconductor components has advanced considerably, and even a SAW filter module of the conventional structure shown in FIG. 4 can be considerably miniaturized by mounting these ultra-compact circuit components on the substrate at high density. However, miniaturization of the circuit components, such as chip components and semiconductor components, is limited, and reduction of the pitch between components is also limited because care must be taken to ensure that the soldered parts of each circuit component are not short-circuited when a large number of circuit components are mounted on the substrate. Thus, SAW filter modules of the conventional structure have suffered from a problem in that the demand for miniaturization in recent years are less easily realized, and low profile devices are not easily realized when mounting chip components.

SUMMARY OF THE INVENTION

Accordingly, the present invention has been achieved in light of the circumstances of the conventional technology described above, and it is an object of the present invention to provide a SAW filter module in which miniaturization and low profile can be easily achieved, without adversely affecting the reliability.

In order to achieve the above object, a SAW filter module of the present invention comprises a substrate, having a recess, mounted on a mother board, a SAW chip mounted in the recess of the substrate, a sealing plate soldered to the substrate to close-off the recess, an insulation layer having a smooth surface disposed on a surface opposite to the sealing plate side of the substrate, circuit elements formed by a thin film technique on the insulation layer, and an end-face electrode which is disposed on an external surface including a side surface of the substrate which is connected to the SAW chip and the circuit elements, thus allowing the SAW chip to pass specified signals.

In the SAW filter module of the above-described configuration, circuit elements such as capacitors and inductors can be formed on the insulation layer with high accuracy by using a thin film technology after providing the insulation layer on one side of the substrate to smooth the surface. Therefore, chip components whose pitch between components is severely limited, can be reduced in number, and thus miniaturization and low profile of the entire module can be easily achieved.

In the above configuration, if a first through hole for connecting the circuit elements to the end-face electrode is formed through the substrate and the insulation layer, and a second through hole for connecting the SAW chip to the circuit elements is formed through the substrate and the insulation layer, miniaturization of the entire module is not prevented when connecting the end-face electrode, the circuit elements, and the SAW chip to each other, and a reliable connection can be easily ensured. For example, in an antenna circuit unit in which a plurality of circuit elements constituting an antenna switching circuit are formed on the insulation layer by a thin film technique, and the SAW chip connected to these circuit elements functions as a filter, miniaturization can be easily achieved and reliability can be easily improved by providing the first and second through holes.

A part for allowing these through holes to penetrate through the insulation layer may be provided before forming the insulation layer on the substrate, or it may be provided after forming the insulation layer on the substrate. This means that, if a protruding deposited part is formed on one end on the circuit element side of each through hole before forming the insulation layer, the deposited part penetrates through the insulation layer as a result by coating the insulation layer on the substrate except for the area where the deposited part is placed.

Alternatively, a part corresponding to one end on the circuit element side of each through hole may be formed by forming a hole in the insulation layer by laser trimming or the like after coating the insulation layer on the entire surface of the substrate.

In addition, in the above configuration, if all chip components including the SAW chip are mounted in the recess of the substrate, the chip components can be completely eliminated from the external surface of the multi-layered substrate, and a low profile SAW filter module can be achieved.

Circuit elements such as capacitors and inductors can be formed with high accuracy on an insulation layer using thin film technology after providing the insulation layer on one side of the substrate and smoothing the surface thereof, and a SAW filter module can be provided thereby, in which the number of chip components whose pitch between components is severely limited can be reduced. As a result, miniaturization can be easily achieved, and the reliability is not reduced.

DESCRIPTION OF THE PREFERRED EMBODIMENTS

Figure 1:
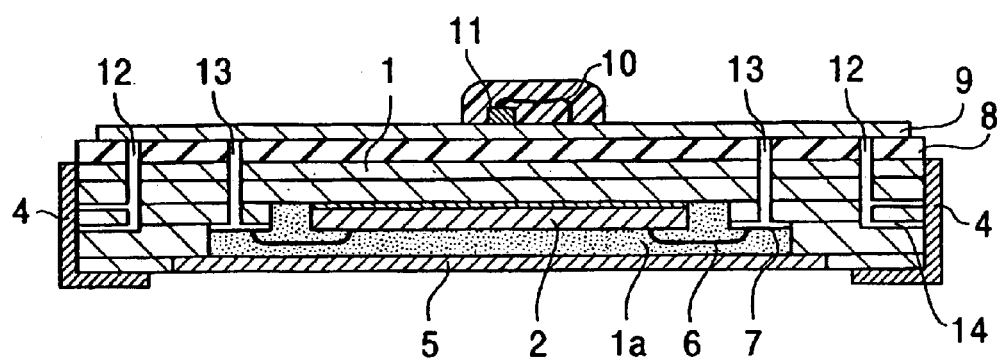
FIG. 1 is a sectional view of a SAW filter module according to a first embodiment of the present invention.
Figure 2:
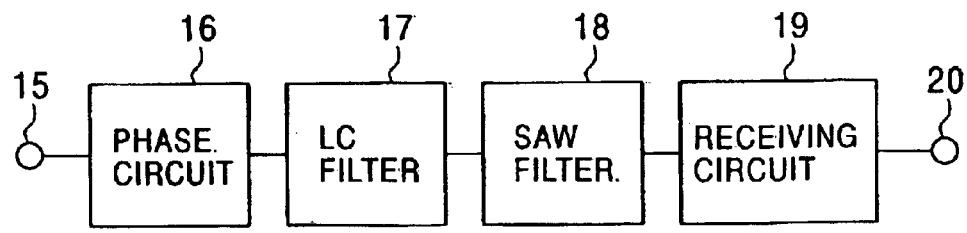
FIG. 2 is a schematic representation of a circuit of the SAW filter module shown in FIG. 1.
Figure 4:
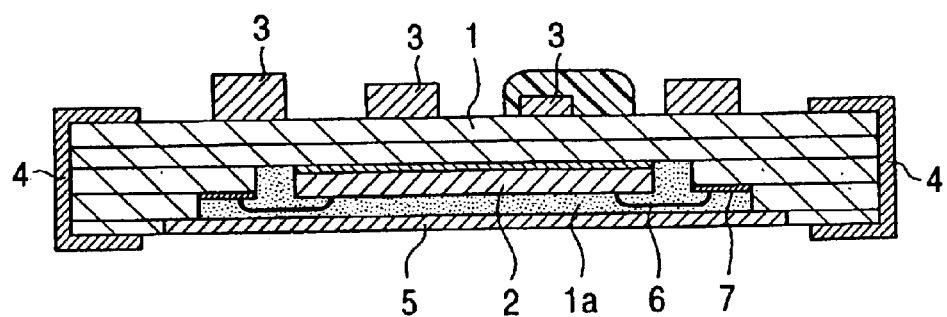
FIG. 4 is a sectional view of a conventional SAW filter module.

The embodiments of the present invention will be described with reference to the drawings. FIG. 1 is a sectional view of a SAW filter module according to a first embodiment, and FIG. 2 is a schematic representation of a circuit of the module, wherein the components corresponding to those in FIG. 4 are represented by the same reference numerals.

A SAW filter module shown in FIG. 1 is used for a reception unit of an antenna switching circuit. The SAW filter module is similar to a conventional example in that a SAW chip 2 functioning as a reception filter is mounted in a recess 1a of a multi-layered substrate 1, whereas it differs from the conventional example in that circuit elements are formed by a thin film technology. This means that the SAW filter module substantially comprises multi-layered substrate 1 mounted on a mother board (not shown), the SAW chip 2 mounted in the recess 1a and connected to a lead pattern 7 by a bonding wire 6, end-face electrodes 4 extending from side surfaces of the multi-layered substrate 1 to the bottom surface thereof, a sealing plate 5, such as a metal plate, soldered to the bottom surface side of the multi-layered substrate 1 to close-off the recess 1a, an insulation layer 8 coated on the upper surface of the multi-layered substrate 1, a thin film circuit 9 in which various kinds of circuit elements such as capacitors and inductors are formed by a thin film technique on the insulation layer 8, a semiconductor chip 11, such as a diode, mounted on the insulation layer 8 and connected to the thin film circuit 9 by a bonding wire 10, and first and second through holes 12 and 13 penetrating through the multi-layered substrate 1 and the insulation layer 8. The semiconductor chip 11 is sealed by a potting material.

The multi-layered substrate 1 is obtained by laminating green sheets formed of a low-temperature co-fired ceramic material, and baking them at the temperature not higher than 1,000° C. The recess 1a is then filled with inert gas, such as nitrogen. The SAW chip 2 has a predetermined electrode pattern on the surface of a piezoelectric substrate of quartz, etc., and is bonded to the top surface of the recess 1a. As shown in FIG. 2, the SAW chip 2 is interposed between an LC filter 17 forming a part of the thin film circuit 9 and a receiving circuit 19, and functions as a SAW filter 18 for reception. In FIG. 2, reference numeral 15 denotes an input terminal, reference numeral 16 denotes a phase circuit, and reference numeral 20 denotes an output terminal.

The insulation layer 8 is formed of glass glaze, polyimide, etc., and the smoothness of the insulation layer 8 can be made high by coating these materials on the upper surface of the multi-layered substrate 1. This means that it is not preferable to form the thin film circuit 9 directly on the multi-layered substrate 1 because the surface of the multi-layered substrate 1 is coarse; rather, the accuracy of the thin film circuit 9 can be increased relatively simply if the multi-layered substrate 1 is coated with the insulation layer 8. The thin film circuit 9 is connected to the end-face electrodes 4 via the first through holes 12 and the lead pattern 14, and the thin film circuit 9 is connected to the SAW chip 2 via the second through holes 13 and the lead pattern 7. Thus, various kinds of circuit elements in the thin film circuit 9, the SAW chip 2, the semiconductor chip 11, etc. are electrically connected to an external circuit via the end-face electrodes 4.

A portion penetrating through the insulation layer 8 out of the first and second through holes 12 and 13 may be formed before forming the insulation layer 8, or after forming the insulation layer 8. In other words, if a protruding deposited part is provided on the upper ends of the through holes 12 and 13 before forming the insulation layer 8, the deposited part penetrates through the insulation layer 8 as a result by coating the insulation layer 8 on the multi-layered substrate 1 apart from the area where the deposited part is formed. Alternatively, the upper ends of the through holes 12 and 13 may be formed by forming a hole in the insulation layer 8 by laser trimming, etc. after coating the insulation layer 8 over the entire surface of the multi-layered substrate 1, and then, an electric conductive material may be filled in the upper ends.

As described above, in the SAW filter module, the thin film circuit 9 on the insulation layer 8 is formed with high accuracy after the surface is smoothed by providing the insulation layer 8 on the multi-layered substrate 1. Since chip components other than the semiconductor chip 11 need not be mounted on the external surface of the multi-layered substrate 1, the number of chip components whose pitch between the components is severely limited, can be considerably reduced, and miniaturization of the entire module can be achieved. In addition, the first through holes 12 are formed so as to connect the thin film circuit 9 to the end-face electrodes 4, and the second through holes 13 are formed so as to connect the SAW chip 2 to the thin film circuit 9, and thus, miniaturization of the entire module is not prevented, and a reliable connection is easily ensured when connecting the end-face electrodes 4, the thin film circuit 9, and the SAW chip 2 to each other.

Figure 3:
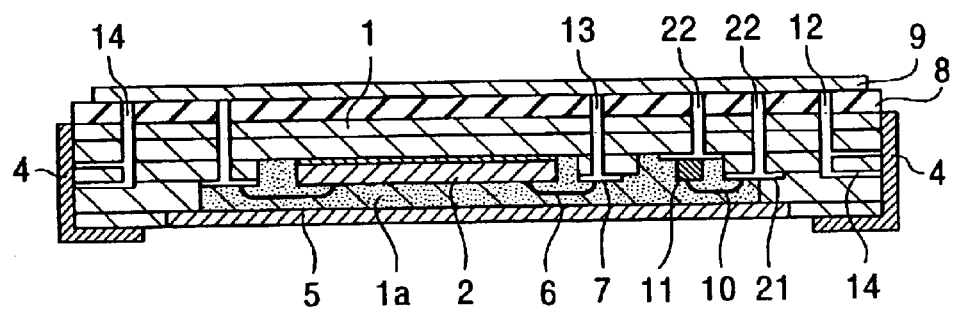
FIG. 3 is a sectional view of the SAW filter module according to a second embodiment of the present invention.

FIG. 3 is a sectional view of a SAW filter module according to the second embodiment, and the components corresponding to those in FIG. 1 are represented by the same reference numerals.

The present embodiment is different from the above first embodiment in that a semiconductor chip 11 which cannot be easily realized as a thin film element is mounted in a recess 1a of a multi-layered substrate 1. The other aspects of the configuration are basically the same as in the first embodiment. This means that, as shown in FIG. 3, the semiconductor chip 11 is mounted in the recess 1a of the multi-layered substrate 1 and is connected to a lead pattern 21 by a bonding wire 10, and a thin film circuit 9 is connected to the semiconductor chip 11 via third through holes 22 and the lead pattern 21. As described above, if the SAW chips 2 and the semiconductor chip 11 are mounted in the recess 1*a* of the multi-layered substrate 1, chip components can be completely eliminated from the external surface of the multi-layered substrate 1, and as a result, not only can a SAW filter module of considerably low profile be realized, but also potting material for sealing the semiconductor chip 11 becomes unnecessary, thus simplifying the manufacturing steps.

What is claimed is:

1. A SAW filter module comprising:
   a substrate having a recess, said substrate being mounted on a another board;
   a SAW chip mounted in said recess of said substrate;
   a sealing plate soldered to said substrate to close-off said recess;
   an insulation layer having a smooth surface disposed on a side opposite to said sealing plate side of said substrate;
   thin film circuit elements on said insulation layer; and
   an end-face electrode which is disposed on an external surface including a side surface of said substrate, said end-face electrode being connected to said SAW chip and said circuit elements.

2. A SAW filter module according to claim 1, wherein a first through hole for connecting said circuit elements to said end-face electrode is formed through said substrate and said insulation layer, and a second through hole for connecting said SAW chip to said circuit elements is formed through said substrate and said insulation layer.

3. A SAW filter module according to claim 2, wherein a plurality of said thin film circuit elements that constitute an antenna switching circuit are formed on said insulation layer.

4. A SAW filter module according to claim 2, wherein one end on a circuit element side of each of said through holes has a deposited part which is deposited so as to protrude, before forming said insulation layer.

5. A SAW filter module according to claim 2, wherein one end on a circuit element side of each of said through holes is formed by forming a hole in said insulation layer after forming said insulation layer.

6. A SAW filter module according to claim 1, wherein all chip components including said SAW chip are mounted in said recess of said substrate.

* * * * *